United States Patent

Naomoto et al.

[15] 3,675,091

[45] July 4, 1972

[54] PLANAR P-N JUNCTION WITH MESH FIELD ELECTRODE TO AVOID PINHOLE SHORTS

[72] Inventors: Susumu Naomoto, Ibaragi; Tadataka Kaneko, Suita; Hideya Esaki, Hirakata, all of Japan

[73] Assignees: Matsushita Electronics Corporation; Matsushita Electric Industrial Co., Ltd., Osaka, Japan

[22] Filed: May 21, 1970

[21] Appl. No.: 39,215

[30] Foreign Application Priority Data

May 28, 1969 Japan....................................44/43039

[52] U.S. Cl...........................317/235 R, 29/589, 317/234 N, 317/235 AG, 317/235 AH

[51] Int. Cl............................................................H01l 5/06

[58] Field of Search..................317/234 N, 235 AG, 235 AH

[56] References Cited

UNITED STATES PATENTS

| | | | |
|---|---|---|---|
| 3,463,977 | 8/1969 | Grove et al. | 317/235 AG |
| 3,446,995 | 5/1969 | Castrucci | 317/235 AH |
| 3,206,827 | 9/1965 | Kriegsman | 317/235 AH |
| 2,981,877 | 4/1961 | Noyce | 317/235 AH |

*Primary Examiner*—John W. Huckert
*Assistant Examiner*—William D. Larkins
*Attorney*—Stevens, Davis, Miller & Mosher

[57] ABSTRACT

A planar p-n junction semiconductor device, wherein an electrode surrounding a p-n junction is provided on a protective film covering the surface of a higher resistivity region of two regions of different conductivity types which form a p-n junction, another electrode is provided in a lower resistivity region in ohmic contact therewith, said two electrodes being electrically connected, and the space charge region is extended and the breakdown voltage of the p-n junction is enhanced when a reverse bias is applied to the p-n junction.

1 Claim, 4 Drawing Figures

S. NAOMOTO,
T. KANEKO &
H. ESAKI
INVENTORS

BY Stevens, Davis, Miller & Mosher
ATTORNEYS

PLANAR P-N JUNCTION WITH MESH FIELD ELECTRODE TO AVOID PINHOLE SHORTS

This invention relates to a high voltage planar p-n junction semiconductor device.

The planar p-n junction semiconductor device is advantageous in that the end part of the p-n junction exposed at the semiconductor substrate is covered by a protective film such as $SiO_2$, and the characteristics of the semiconductor device are not altered by the influence of the outer atmosphere. Accordingly, such a device retains favorable characteristics and is also suitable for mass production.

However, semiconductor devices of this type are disadvantageous in that the impurity tends to concentrate at the surface portion of the semiconductor substrate under the protective film and the breakdown voltage of the end part of the p-n junction in the vicinity of the semiconductor substrate surface is low compared with the breakdown voltage of the p-n junction in the semiconductor substrate. This is due to the strain which takes place between the protective film and the semiconductor substrate, as well as other causes, so that the overall breakdown voltage of the planar p-n junction semiconductor device tends to be low.

This invention is intended to obviate the deficiencies described above, and a primary object thereof is to provide a planar p-n junction semiconductor device wherein the space charge layer is effectively extended when the p-n junction is reversely biased thereby obtaining a high breakdown voltage.

A second object of the invention is to provide an electrode structure, wherein a metal layer surrounding a p-n junction is provided on a protective film covering the surface of a higher resistivity region of two regions of different conductivity type which form a p-n junction, another ohmic-contact electrode is provided in a lower resistivity region and these two electrodes are electrically connected.

A third object of the invention is to provide an electrode structure, wherein the area of a metal layer provided on a protective layer is made as small as possible and imperfections in the protective film under the metal layer are made as few as possible.

Figure 1A:
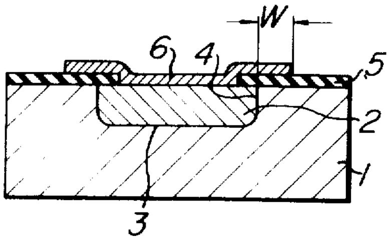
FIG. 1a PRIOR ART
Figure 1B:
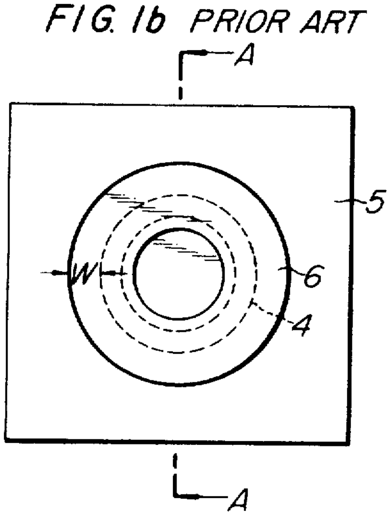
FIG. 1b PRIOR ART
Figure 2A:
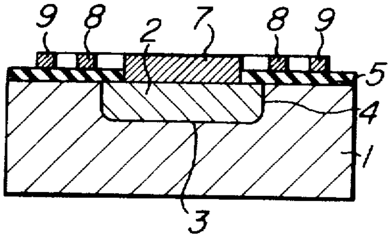
Figure 2B:
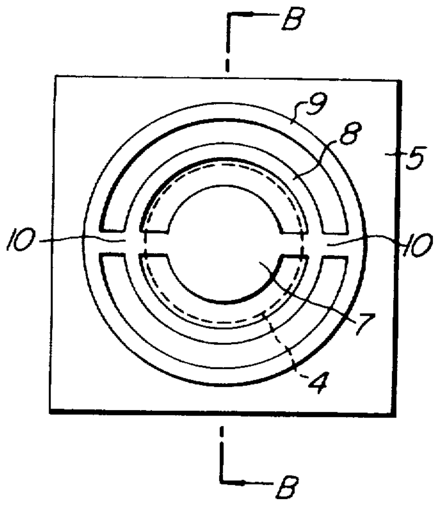

Other objects, features and advantages of this invention will become more apparent from the following detailed description of the invention when taken in conjunction with the accompanying drawings, in which:

FIGS. 1*a* and 1*b* show sectional and plan views of a planar p-n junction semiconductor devices recording to the prior art, and FIGS. 2*a* and 2*b* show sectional and plan views of a planar p-n junction semiconductor device according to an embodiment of this invention.

A proposal has already been made to enhance the breakdown voltage of a planar p-n junction semiconductor device by extending an electrode metal layer to a protective film covering the surface of a semiconductor substrate and forming a space charge layer in a semiconductor substrate under the protective film. FIGS. 1*a* and 1*b* show such a semiconductor device provided by the method of the prior art.

In FIG. 1*a*, 1 designates, for example, an n-type silicon substrate, 2 designates a p-type diffused region having a conductivity different from that of the substrate 1, 3 designates a p-n junction, 4 indicates an end part of the p-n junction, 5 indicates a silicon oxide film and 6 designates an electrode metal layer in ohmic contact with the p-type diffused region. The electrode metal layer 6 extends over the silicon oxide film 5 and exceeds the end part of the p-n junction by width W.

FIG. 1*b* is a plan view of such a planar p-n junction semiconductor device, and the section cut along line A—A is shown in FIG. 1*a*.

When a reverse voltage is applied to this device, the extension of the space charge layer from the p-n junction reaches a space charge layer at the surface part of the semiconductor substrate formed by the effect of the electrode metal layer on the protective film so that the breakdown voltage of the end part 4 of the p-n junction is enhanced, and thus the breakdown voltage of the planar p-n junction semiconductor device itself is effectively enhanced. In a planar p-n junction semiconductor device whose breakdown voltage is enhanced in this way, the space charge layer is enlarged and the breakdown voltage is enhanced when the width W of the electrode metal layer extending over the silicon oxide film is further enlarged, but the effect of such an electrode structure are expected only under the ideal condition that the silicon oxide film 5 is free from imperfections.

However, it is quite rare that a silicon oxide film of the type usually obtained by deposition is free from imperfections. Accordingly, in a conventional structure as shown in FIGS. 1*a* and 1*b* in which the electrode metal layer is extended over the silicon oxide film, the area of the silicon oxide film under the electrode metal layer increases by the width of the electrode metal layer to be enlarged and the probability that the silicon oxide film under the electrode metal layer includes imperfections increases substantially. Thus, the two regions of different conductivity type which form the p-n junction may be short-circuited through the silicon oxide film, and the yield of the high voltage planar p-n junction semiconductor device lowered. Such disadvantage is unavoidable as long as such a structure is employed.

This invention is intended to obviate the deficiencies of high voltage planar p-n junction semiconductor devices according to the prior art and to reliably enhance the breakdown voltage.

Now, a planar p-n junction semiconductor device according to an embodiment of this invention will be described hereinbelow with reference to FIG. 2.

FIGS. 2*a* and 2*b* are sectional and plan views of a planar p-n junction semiconductor device of this invention, and FIG. 2*a* shows a cross-section taken along the line B—B in FIG. 2*b*.

A semiconductor device of this invention as shown in FIGS. 2*a* and 2*b* comprises fine, annular metal layers 8 and 9 on a silicon oxide film covering the surface of, for example, an n-type silicon substrate, and the annular metal layers are connected electrically to the electrode metal layer 7, which is in ohmic contact with the p-type diffused layer by way of a connection means 10 consisting, for example, of a fine metal layer as shown in FIG. 2*b*. In such a structure, the potentials at the annular metal layers 8 and 9 and the p-type diffused region 2 become equal when the p-n junction is reversel biased, and the space charge layer is effectively enlarged into the n-type substrate as in the conventional device and the breakdown voltage increases.

In the planar p-n junction semiconductor device according to this invention as described hereinabove, it is important to make the width of the metal layer on the silicon oxide film as narrow as possible, to make the area of the silicon oxide film under the metal layer as small as possible, to make the metal layer surround the end part of the p-n junction, and to make the part where the metal layer is to be provided, lie on the silicon oxide film covering the higher resistivity region of the two regions of different conductivity type which form a p-n junction.

By satisfying these requirements, the area of the silicon oxide film under the metal layer is reduced compared with the conventional one, the probability of the appearance of imperfections in this part decreases, and the chance of short-circuiting due to imperfections decreases. Moreover, the space charge layer can be reliably enlarged when the p-n junction is reversely biased and the breakdown voltage of the present semiconductor device competes well with that of the conventional one.

It is to be noted here that the means for connecting the metal layer on the silicon oxide film and the electrode metal layer is not necessarily a fine metal layer as shown in FIG. 2, but the metal layer and the electrode metal layer may be connected by a metal wire.

The number of metal layers on the silicon oxide film is arbitary as long as it is more than one.

The shape of the metal layer is also arbitary so long as the metal layer surrounds the end part of the p-n junction or it is provided along the end part of the p-n junction, and the metal layer is not necessarily continuous as long as the enlarged space charge layer can cross the metal layer. Further, the metal layer may be of a mesh type.

As has been fully described hereinabove, the high voltage planar p-n junction semiconductor device according to this invention achieves the effect of enhancing the breakdown voltage comparable with that of conventional devices. Moreover, since the area of the metal layer for causing this effect is remarkably reduced, the area of the protective film under the metal layer is naturally reduced so that the probability of including imperfections is lowered and disadvantages due to imperfections are reduced and the production yield is enhanced.

What is claimed is:

1. A semiconductor device comprising a semiconductor substrate providing a first semiconductive region of one conductivity type having at least one surface; a second semiconductor region of opposite conductivity type formed within said first semiconductor region and forming with said first semiconductor region a dish-shaped p-n junction extending to a selected surface; a protective film of insulating material covering said selected surface including the intersection of said p-n junction with said surface; at least two ring-shaped metal layers overlying and adherent to said protective film, and surrounding the intersection of said p-n junction with said selected surface; and an ohmic metal contact attached to said second semiconductor region, said ring-shaped metal layers and said ohmic metal contact being electrically connected by a conductive tie metal layer so as to be at the same electrical potential.

* * * * *